United States Patent
Inoue et al.

[19]

[11] Patent Number: 6,122,059
[45] Date of Patent: *Sep. 19, 2000

[54] SCANNING EXPOSURE APPARATUS AND DEVICE FABRICATION METHOD IN WHICH MULTIPLE LASER INTERFEROMETERS USE A RESPECTIVE LASER HEAD

[75] Inventors: Mitsuru Inoue; Toshiaki Yamazaki, both of Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/961,222

[22] Filed: Oct. 30, 1997

[30] Foreign Application Priority Data

Nov. 5, 1996 [JP] Japan ................................. 8-307487

[51] Int. Cl.⁷ ..................................................... G01B 9/02
[52] U.S. Cl. ........................................... 356/358; 356/363
[58] Field of Search ..................................... 356/358, 363, 356/400, 401; 355/53; 250/559.29, 559.3

[56] References Cited

U.S. PATENT DOCUMENTS

| | | | |
|---|---|---|---|
| 4,655,594 | 4/1987 | Wittekoek et al. | 356/363 |
| 5,194,893 | 3/1993 | Nishi | 355/53 |
| 5,281,996 | 1/1994 | Bruning et al. | 355/77 |

*Primary Examiner*—Samuel A. Turner
*Attorney, Agent, or Firm*—Fitzpatrick, Cella, Harper & Scinto

[57] ABSTRACT

The position of an original plate stage for moving an original plate and the position of a substrate stage for moving a substrate are measured by using an original plate laser interferometer and a substrate laser interferometer, respectively. While control is performed on the basis of the measured values, the pattern of the original plate is transferred onto the substrate by scan exposure by moving the original plate stage and the substrate stage in a scan direction. The measurements of the stage positions by the original plate laser interferometer and the substrate laser interferometer are performed by using light from a single laser head. If each of the original plate laser interferometer and the substrate laser interferometer includes a laser interferometer in the Y direction as the scan direction and a laser interferometer in the X direction perpendicular to the Y direction, the measurements by the original plate and substrate Y-direction laser interferometers are performed by using light from a single Y-direction laser head, and the measurements by the original plate and substrate X-direction laser interferometers are performed by using light from a single X-direction laser head.

6 Claims, 5 Drawing Sheets

SEMICONDUCTOR DEVICE FABRICATION FLOW

WAFER PROCESS

SCANNING EXPOSURE APPARATUS AND DEVICE FABRICATION METHOD IN WHICH MULTIPLE LASER INTERFEROMETERS USE A RESPECTIVE LASER HEAD

BACKGROUND OF THE INVENTION

1. Field of the Invention

The present invention relates to an exposure apparatus used to fabricate a semiconductor device and the like by projecting a designed pattern by exposure onto a resist on a substrate, and a device fabrication method capable of using the same.

2. Description of the Related Art

Conventionally, a stepper and a scanning exposure apparatus are known as exposure apparatuses of this sort. A stepper sequentially forms by exposure a mask pattern in a plurality of exposure regions on a substrate such as a wafer by using a projection optical system while moving the substrate step by step. A scanning exposure apparatus moves a mask and a substrate relative to a projection optical system and transfers the mask pattern onto the substrate by exposure by scanning the mask and the substrate with slit-like exposure light.

Also, a step-and-scan type exposure apparatus has been proposed recently to enable exposure of finer patterns with higher precision. This exposure apparatus projects a high-precision fine pattern by exposure in a plurality of regions on a substrate by repeating step movement and scan exposure. In this exposure apparatus, only light in a portion relatively close to the optical axis of a projection optical system is selectively used as exposure light through a slit. This enables exposure of finer patterns with higher precision. Additionally, in the scan exposure, a reticle stage and a wafer stage are moved in a scan direction or the like while being precisely controlled. For this purpose, the positions of these stages are monitored by using laser interferometers.

In scanning exposure apparatuses of the above sort, however, the accuracy of the movement of the reticle stage and the wafer stage in, e.g., the scan direction is unsatisfactory to be able to effectively expose finer patterns with high precision.

SUMMARY OF THE INVENTION

The present invention has been made in consideration of the above conventional problems and has as its object to improve the accuracy of the movement of an original plate stage and a substrate stage during scan exposure in an exposure apparatus and a device fabrication method capable of using the same.

To achieve the above object, an exposure apparatus of the present invention is a scanning exposure apparatus comprising an original plate stage for moving an original plate, a substrate stage for moving a substrate, and an original plate laser interferometer and a substrate laser interferometer for measuring positions of the original plate stage and the substrate stage, respectively, in which a pattern of the original plate is transferred onto the substrate by exposure by moving the original plate stage and the substrate stage in a scan direction on the basis of measured values obtained by the laser interferometers, wherein the original plate laser interferometer and the substrate interferometer use light from a single laser head.

Furthermore, the original plate laser interferometer comprises a Y-direction laser interferometer for measuring an original plate stage position in a Y direction as the scan direction and an X-direction laser interferometer for measuring an original plate stage position in an X direction perpendicular to the scan direction, the substrate laser interferometer comprises a Y-direction laser interferometer for measuring a substrate stage position in the Y direction and an X-direction laser interferometer for measuring a substrate stage position in the X direction, the original plate and substrate Y-direction laser interferometers use light from a single Y-direction laser head, and the original plate and substrate X-direction laser interferometers use light from a single X-direction laser head.

In this apparatus, the original plate or substrate Y- or X-direction laser interferometer comprises two laser interferometers, and measured values obtained by the two laser interferometers can be used to obtain a position in a θ direction, around a Z-axis direction, of the original plate stage or the substrate stage.

A device fabrication method of the present invention is a device fabrication method comprising the steps of measuring a position of an original plate stage for moving an original plate and a position of a substrate stage for moving a substrate by using an original plate laser interferometer and a substrate laser interferometer, respectively, and transferring a pattern of the original plate by scan exposure onto the substrate by moving the original plate stage and the substrate stage in a scan direction while performing control on the basis of the measured values, wherein the measurements of the stage positions by the original plate laser interferometer and the substrate laser interferometer are performed by using light from a single laser head.

Furthermore, the original plate laser interferometer comprises a Y-direction laser interferometer for measuring an original plate stage position in a Y direction as the scan direction and an X-direction laser interferometer for measuring an original plate stage position in an X direction perpendicular to the scan direction, the substrate laser interferometer comprises a Y-direction laser interferometer for measuring a substrate stage position in the Y direction and an X-direction laser interferometer for measuring a substrate stage position in the X direction, the measurements by the original plate and substrate Y-direction laser interferometers are performed by using light from a single Y-direction laser head, and the measurements by the original plate and substrate X-direction laser interferometers are performed by using light from a single X-direction laser head.

In this method, the original plate or substrate Y- or X-direction laser interferometer comprises two laser interferometers, and a position in a θ direction, around a Z-axis direction, of the original plate stage or the substrate stage can be obtained on the basis of measured values obtained by the two laser interferometers.

In the present invention as described above, the measurements of the stage positions by the original plate laser interferometer and the substrate interferometer are performed by using light from the same laser head. Consequently, the positional relationship between the original plate and the substrate can be accurately measured regardless of variations in the laser beam. Accordingly, the original plate and the substrate can be accurately moved in synchronism with each other by using the measurement results.

Also, the measurements by the original plate and substrate Y-direction laser interferometers are performed by using light from the same Y-direction laser head, and the measurements by the original plate and substrate X-direction laser interferometers are performed by using light from the same X-direction laser head. Consequently, the positional relationships in the X and Y directions of the original plate and the substrate can be accurately measured regardless of variations in the laser beams. Accordingly, the original plate and the substrate can be accurately synchronously moved in the scan direction on the basis of the measurement results. Additionally, a predetermined positional relationship between the original plate and the substrate can also be accurately measured.

Furthermore, the original plate or substrate Y- or X-direction laser interferometer includes two laser interferometers, and the position in the θ direction, around the Z-axis direction, of the original plate stage or the substrate stage is obtained on the basis of measured values obtained by these two laser interferometers. Consequently, the positional relationship in the θ direction between the original plate and the substrate can be accurately measured regardless of variations in the laser beam. Therefore, the positional relationship in the θ direction between the original plate and the substrate can be accurately maintained by using the measurement result.

Accordingly, the pattern of the original plate can be projected onto a substrate by scan exposure with high accuracy, so a device having a high-precision circuit pattern or the like can be fabricated.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

An embodiment of the present invention will be described below with reference to the accompanying drawings.

Figure 1:
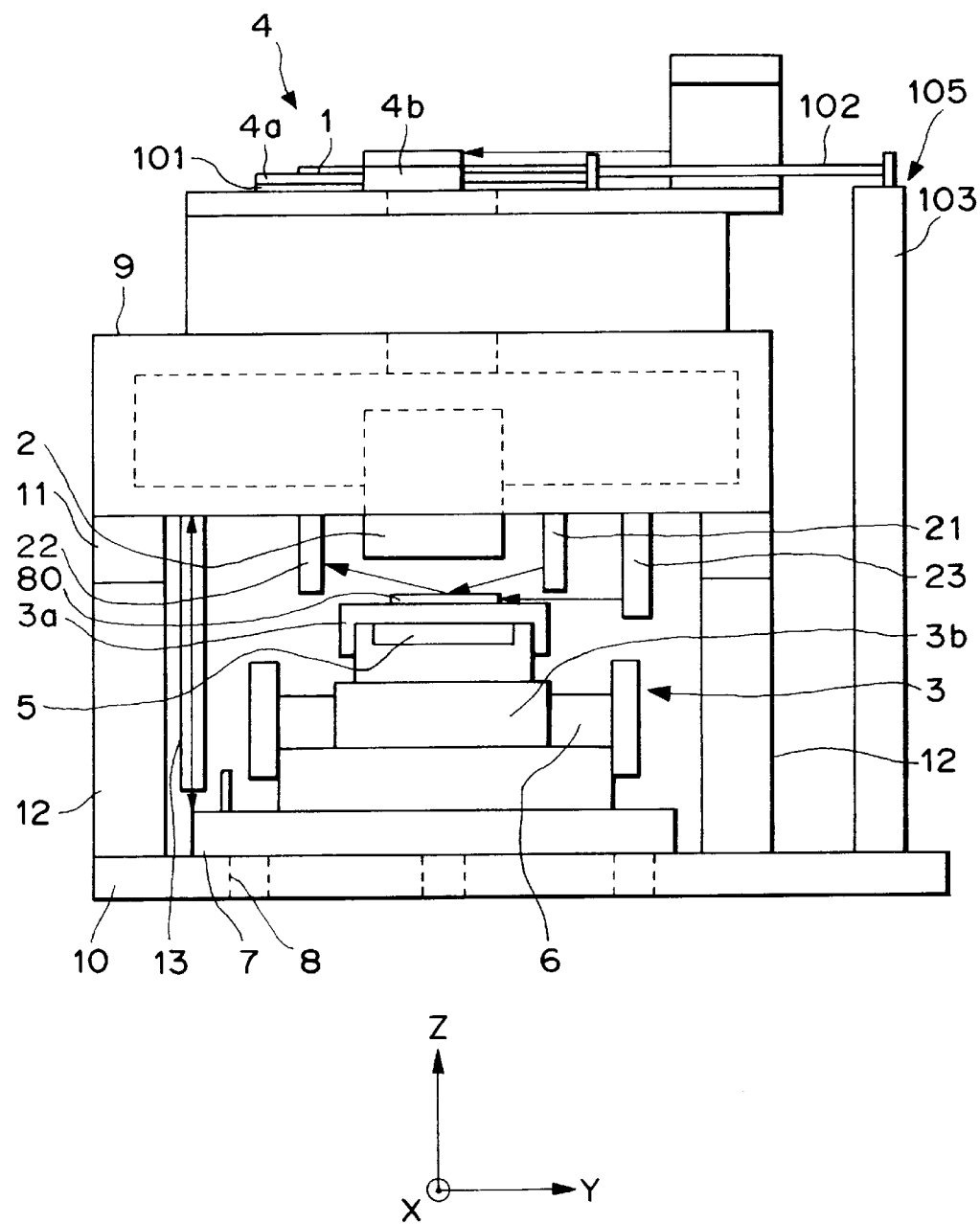
FIG. 1 is a schematic side view showing an exposure apparatus according to an embodiment of the present invention.
Figure 2:
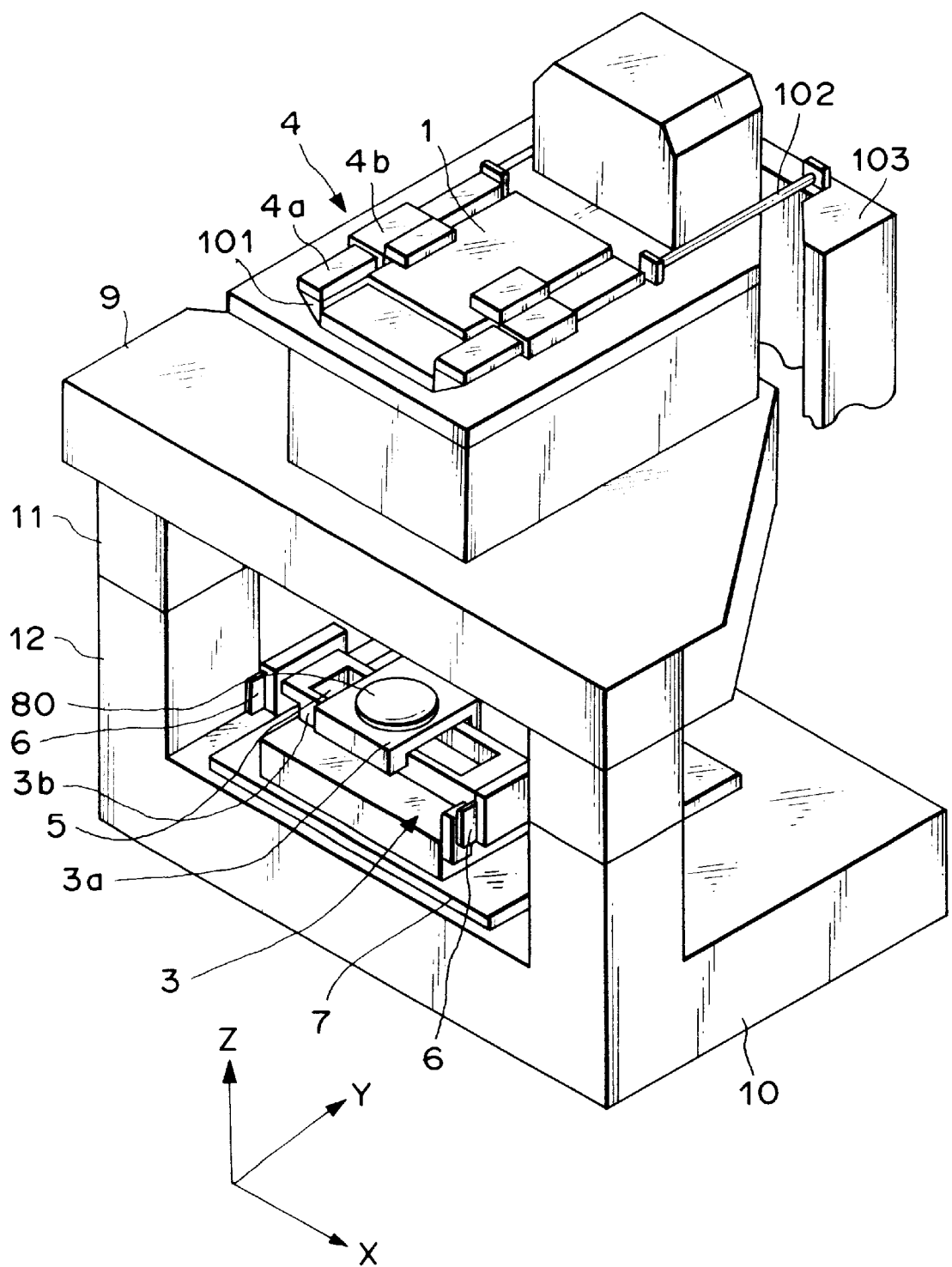
FIG. 2 is a perspective view showing the outer appearance of the exposure apparatus in FIG. 1.

FIG. 1 is a schematic side view showing an exposure apparatus according to an embodiment of the present invention. FIG. 2 is a perspective view showing the outer appearance of the exposure apparatus.

As shown in FIGS. 1 and 2, this exposure apparatus is a step-and-scan type exposure apparatus which uses a projection optical system 2 to project a portion of the pattern of a reticle onto a wafer on a fine-movement stage 80 placed on an XY stage unit 3, and forms the pattern of the reticle on the wafer by exposure by synchronously scanning the reticle and the wafer in the Y direction relative to the projection optical system 2, while performing step movement for repetitively performing this scan exposure in a plurality of regions on the wafer.

The reticle is moved in a scan direction (Y direction) by a reticle stage unit. This stage unit comprises a linear motor 4 which moves a movable member 4b in the scan direction by applying a thrust between a fixed member 4a and the movable member 4b. A reticle stage 1 is coupled with the movable member 4b. The fixed member 4a is supported by a first support means 101 so as to have a certain degree of freedom in the Y direction. Also, the fixed member 4a is supported rigidly in the Y direction and softly in other directions by a second support means 105. This second support means 105 has a pillar 103 extending upward from a base frame 10 and a uniaxial support means 102 extending in the Y direction from the pillar 103. The uniaxial support means 102 supports the fixed member 4a rigidly in the Y direction and softly in other directions.

The reticle stage 1 is driven in the Y direction by the linear motor 4, an X stage 3a of the XY stage unit 3 is driven in the X direction by a linear motor 5, and a Y stage 3b is driven in the Y direction by a linear motor 6. Synchronous scanning of the reticle and the wafer is performed by driving the reticle stage 1 and the Y stage 3b in the Y direction at a fixed velocity ratio (e.g., 4:1). Also, step movement in the X direction is done by the X stage 3a.

The XY stage unit 3 is placed on a stage platen 7 which is supported on the floor or the like at three points via three dampers 8. The first support means 101 and the projection optical system 2 are placed on a cylinder platen 9 which is supported on the base frame 10 via three dampers 11 and three columns 12. The dampers 8 are active dampers which actively suppress or remove vibrations in six-axis directions. However, passive dampers can also be used, or the member can be supported without using any dampers.

In this arrangement, a conveyor means (not shown) loads a wafer onto the XY stage unit 3 through a conveyance path between the columns 12 in the front portion of the apparatus. When predetermined positioning is complete, the exposure apparatus transfers the pattern of a reticle by exposure onto a plurality of exposure regions on the wafer while repeating scan exposure and step movement. In the scan exposure, the exposure apparatus moves the reticle stage 1 and the Y stage 3b in the Y direction (scan direction) at a predetermined velocity ratio and scans the pattern on the reticle with slit-like exposure light. Also, the exposure apparatus scans the wafer with the projected image to transfer the pattern on the reticle by exposure onto a predetermined exposure region on the wafer. When scan exposure for one exposure region is complete, the exposure apparatus drives the X stage 3a in the X direction to move the wafer step by step, thereby setting another exposure region in the start position of scan exposure and performing scan exposure. Note that the arrangement of individual exposure regions, scan in the positive or negative direction in the Y direction, the order of exposure of the exposure regions, and like factors are set such that exposure is sequentially efficiently performed by the combination of the step movement in the X direction and the movement for the scan exposure in the Y direction.

Figure 3:
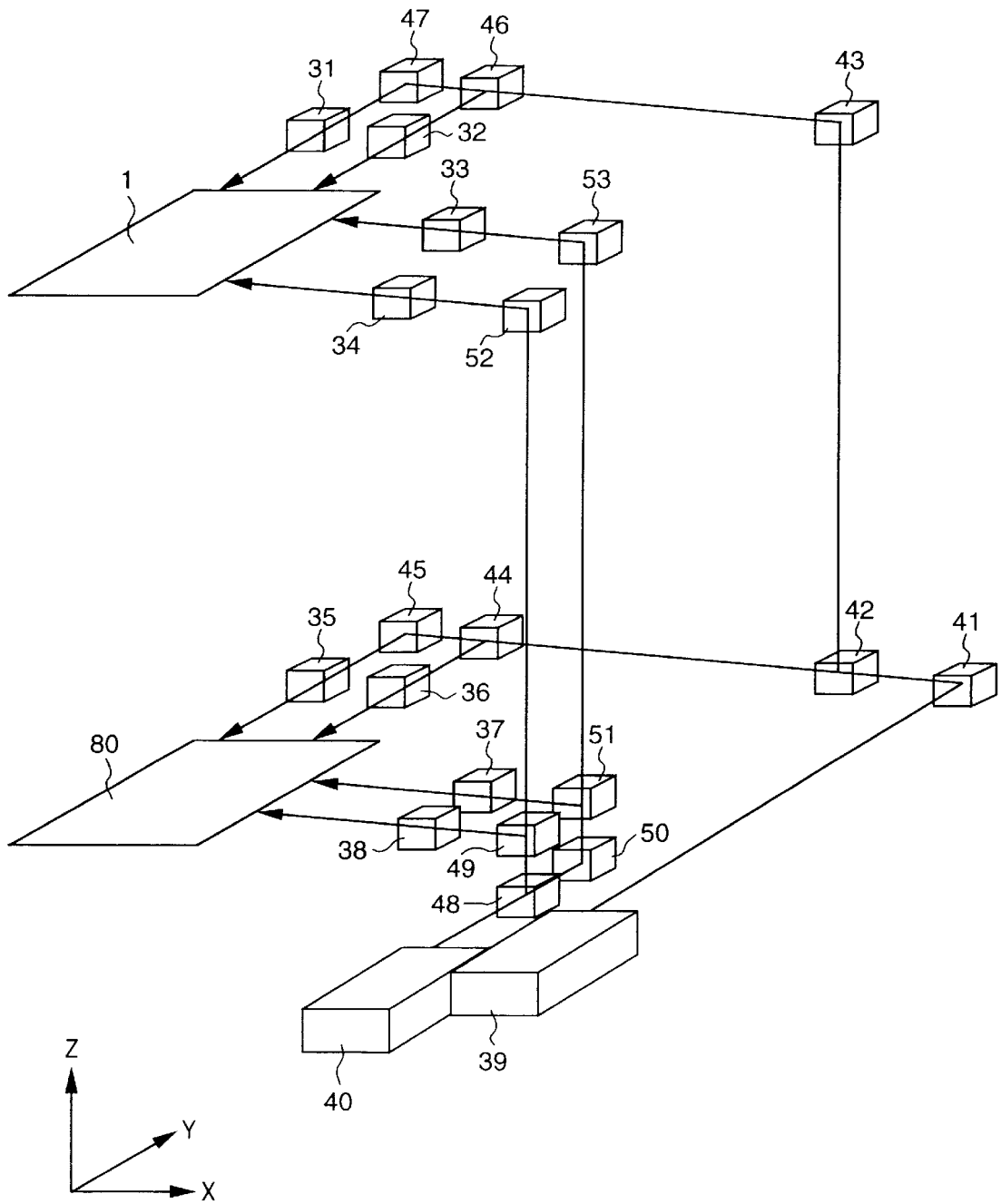
FIG. 3 is a schematic view showing an arrangement for measuring the positions of individual stages in FIG. 1 to control the driving of these stages.

FIG. 3 is a schematic view showing an arrangement for measuring the positions of the reticle stage 1, the X stage 3a, the Y stage 3b, and the fine-movement stage unit 80 in order to control the driving of these stages.

As shown in FIG. 3, this arrangement includes reticle laser interferometers 31, 32, 33, and 34 and wafer laser interferometers 35, 36, 37, and 38 for measuring the positions of the reticle stage 1 and the fine-movement stage 80, respectively. The reticle laser interferometers 31 and 32 and the wafer laser interferometers 35 and 36 use a laser beam from a laser head 39. The reticle laser interferometers 33 and 34 and the wafer laser interferometers 37 and 38 use a laser beam from a laser head 40. The reticle laser interferometers 31 and 32 are used to measure the position in the Y-axis direction (scan direction) and a θ position around a Z axis of the reticle stage 1. The reticle laser interferometers 33 and 34 are used to measure the position in the X-axis direction and the θ position around the Z axis of the reticle stage 1. The wafer laser interferometers 35 and 36 are used to measure the position in the Y-axis direction and the θ position around the Z axis of the fine-movement stage 80. The wafer laser interferometers 37 and 38 are used to measure the position in the X-axis direction and the θ position around the Z axis of the fine-movement stage 80. Although not shown, mirrors are fixed on the reticle stage 1 and the fine-movement stage 80 to reflect light in the measurement directions from the individual laser interferometers to allow these laser interferometers to perform measurements. The laser interferometers 31 to 38 are fixed on the cylinder platen 9.

A laser beam emitted in the Y direction from the laser head 39 is reflected in the X direction by a reflecting mirror 41 and split in the X and Z directions by a beam splitter 42. The split laser beam in the X direction is split in the X and Y directions by a beam splitter 44. The split laser beam in the Y direction is guided to the laser interferometer 36. The split laser beam in the X direction is reflected in the Y direction by a reflecting mirror 45 and guided to the laser interferometer 35. The split laser beam in the Z direction is reflected in the X direction by a reflecting mirror 43 and split in the X and Y directions by a beam splitter 46. The split laser beam in the X direction is reflected in the Y direction by a reflecting mirror 47 and guided to the laser interferometer 31. The split laser beam in the Y direction is directly incident on the laser interferometer 32 and used by the laser interferometer 32. Analogously, a laser beam from the laser head 40 is split and guided by beam splitters 48, 49, and 51 and reflecting mirrors 50, 52, and 53 and used by the laser interferometers 33, 34, 37, and 38.

In scan exposure, the measured value of the position in the Y direction of the reticle stage 1 obtained by the laser interferometer 31 or 32 is fed back to control the driving of the linear motor 4, thereby moving the reticle stage 1 in the Y direction. Also, the measured value of the position in the Y direction of the fine-movement stage 80 obtained by the laser interferometer 36 is fed back to control the driving of the linear motor 6, thereby moving the Y stage 3b in the Y direction. As described previously, it is necessary to synchronously move the reticle stage 1 and the Y stage 3b so that a fixed velocity ratio (e.g., 4:1) is obtained. Since the laser interferometer 31 or 32 and the laser interferometers 35 and 36 use the laser beam from the same laser head 39, the same measurement error being due to a variation in the laser beam occurs in both the reticle and wafer laser interferometers. Accordingly, no synchronous difference is caused by a variation in the laser beam.

In this scan exposure, the reticle stage 1 and the fine-movement stage 80 must hold predetermined positional relationships at any instant in the θ and the X directions. The position in the θ direction of the fine-movement stage 80 is so adjusted as to follow variations in the position in the θ direction of the reticle stage 1 on the basis of the measured values of the position in the θ direction of the reticle stage 1 obtained by the laser interferometers 31 and 32 and the measured values of the position in the θ direction of the fine-movement stage 80 obtained by the laser interferometers 35 and 36. In this manner, the predetermined positional relationship in the θ direction between the reticle stage 1 and the fine-movement stage 80 is held. Also, the position in the X direction of the X stage 3a is so adjusted as to follow variations in the position in the X direction of the reticle stage 1 on the basis of the measured values of the position in the X direction of the reticle stage 1 obtained by the laser interferometers 33 and 34 and the measured value of the position in the X direction of the fine-movement stage 80 obtained by the laser interferometer 37 or 38. In this way, the predetermined positional relationship in the X direction between the reticle stage 1 and the fine-movement stage 80 is held. In either case, the reticle and wafer interferometers use the laser beam from the same laser head, so the positional relationship between the two stages can be accurately held independently of any variations in the laser beam. Furthermore, the control in the θ direction can also be separately performed for the two stages. If this is the case, one laser interferometer can be omitted from each stage.

Figure 4:
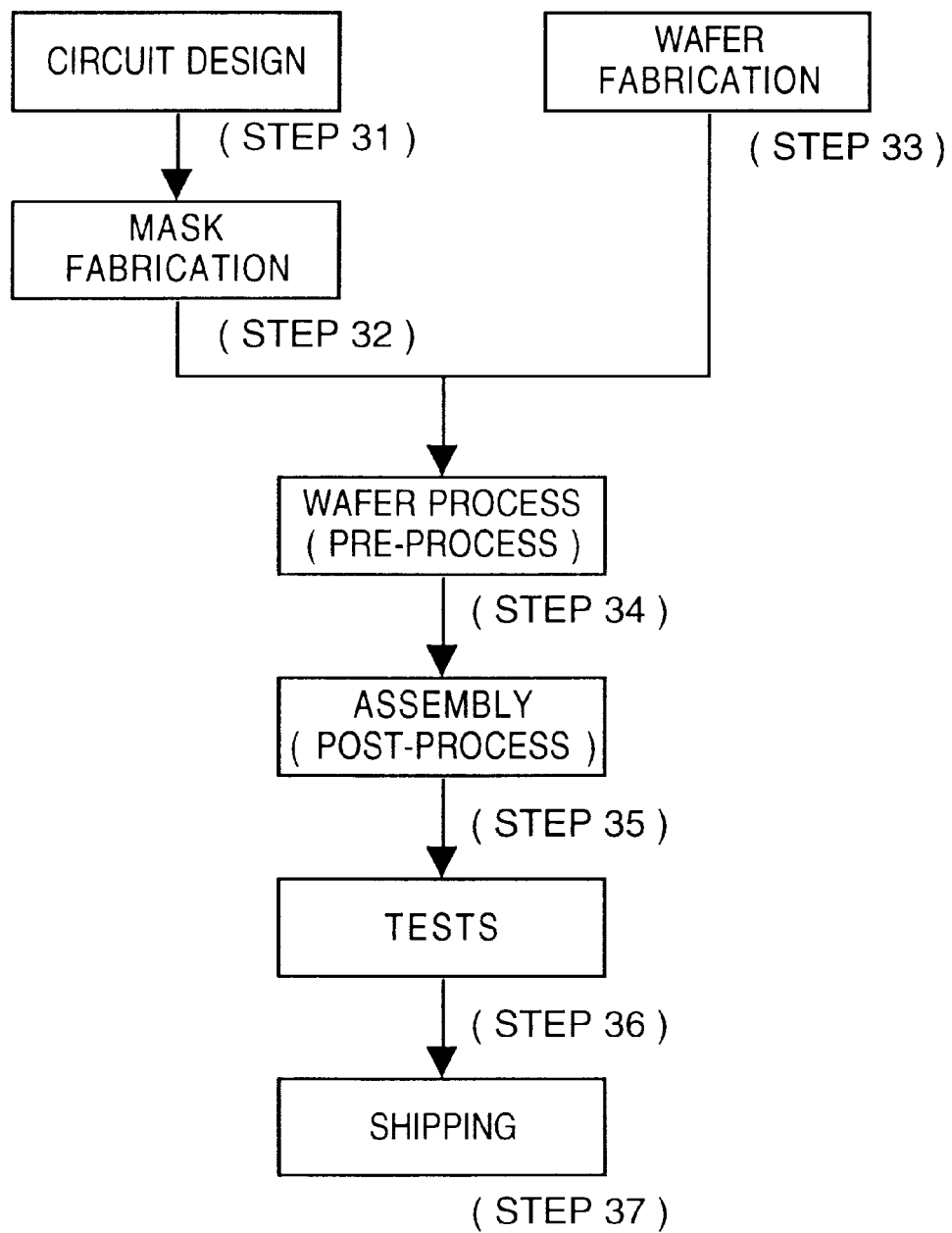
FIG. 4 is a flow chart showing the flow of the fabrication of a microdevice capable of being fabricated by the apparatus in FIG. 1.

An example of device fabrication in which the above exposure apparatus is usable will be described below. FIG. 4 is a flow chart showing the flow of the fabrication of a microdevice (e.g., a semiconductor chip such as an IC or an LSI, a liquid crystal panel, a CCD, a thin-film magnetic head, or a micromachine).

In step 31 (circuit design), a circuit of a semiconductor device is designed. In step 32 (mask fabrication), a mask on which the designed circuit pattern is formed is fabricated. In step 33 (wafer fabrication), a wafer is fabricated by using a material such as silicon. Step 34 (wafer process) is called a pre-process in which the fabricated mask and wafer are used to form an actual circuit on the wafer by lithography. Step 35 (assembly) is called a post-process in which semiconductor chips are formed by using the wafer fabricated in step 34. This process includes steps such as an assembly step (dicing, polishing) and a packaging step (chip encapsulation). In step 36 (test), tests such as an operation test and a durability test are performed for the semiconductor devices fabricated in step 35. The semiconductor devices are completed through these steps and shipped (step 37).

Figure 5:
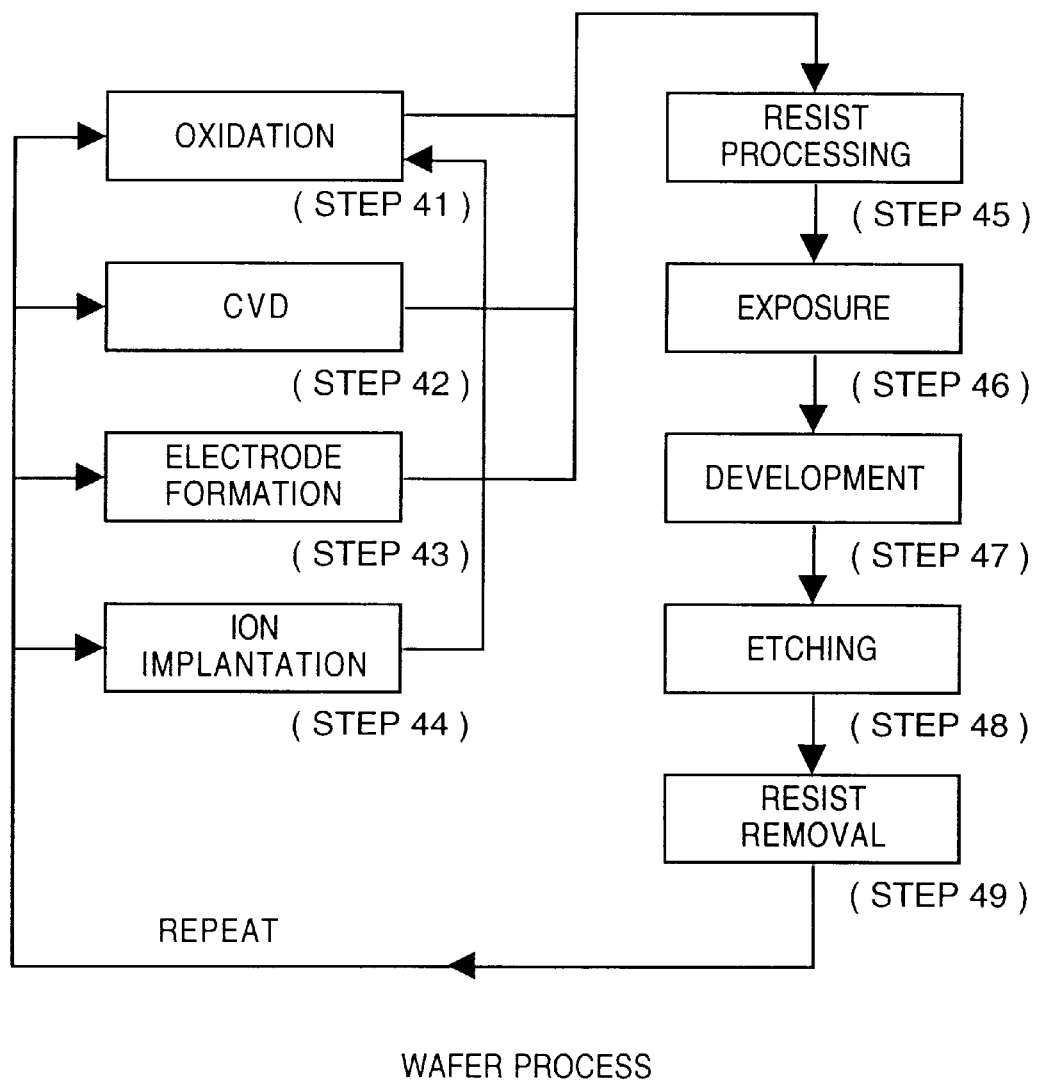
FIG. 5 is a flow chart showing a detailed flow of a wafer process in FIG. 4.

FIG. 5 is a flow chart showing a detailed flow of the wafer process described above.

In step 41 (oxidation), the surface of a wafer is oxidized. In step 42 (CVD), an insulating film is formed on the wafer surface. In step 43 (electrode formation), electrodes are formed on the wafer by vapor deposition. In step 44 (ion implantation), ions are implanted into the wafer. In step 45 (resist processing), the wafer is coated with a photosensitive material. In step 46 (exposure), the exposure apparatus described above is used to transfer the circuit pattern of a mask onto the wafer by exposure. In step 47 (development), the exposed wafer is developed. In step 48 (etching), portions except for the developed resist image are etched away. In step 49 (resist removal), the unnecessary resist after etching is removed. Multiple circuit patterns are formed on the wafer by repetitively performing these steps.

By the use of this fabrication method, highly integrated semiconductor devices, which are conventionally difficult to fabricate, can be fabricated with a low cost.

The present invention is not limited to the above embodiments and various changes and modifications can be made within the spirit and scope of the present invention. Therefore, to apprise the public of the scope of the present invention the following claims are made.

What is claimed is:

1. A scanning exposure apparatus comprising:

an original plate stage for moving an original plate;

a substrate stage for moving a substrate; and an original plate laser interferometer and a substrate laser interferometer for measuring positions of said original plate stage and said substrate stage, respectively, in which a pattern of the original plate is transferred onto the substrate by exposure by moving said original plate stage and said substrate stage in a scan direction on the basis of measured values obtained by said laser interferometers, wherein said original plate laser interferometer comprises a Y-direction laser interferometer for measuring an original plate stage position in a Y direction as the scan direction and an X-direction laser interferometer for measuring an original plate stage position in an X direction perpendicular to the scan direction, said substrate laser interferometer comprises a Y-direction laser interferometer for measuring a substrate stage position in the Y direction and an X-direction laser interferometer for measuring a substrate stage position in the X direction, and said original plate and substrate Y-direction laser interferometers use light from a single Y-direction laser head and said original plate and substrate X-direction laser interferometers use light from a single X-direction laser head.

2. The apparatus according to claim 1, wherein said original plate or substrate Y- or X-direction laser interferometer comprises two laser interferometers, and measured values obtained by said two laser interferometers are used to obtain a position in a θ direction, around a Z-axis direction, of said original plate stage or said substrate stage.

3. A device fabrication method comprising the steps of:

measuring a position of an original plate stage for moving an original plate and a position of a substrate stage for moving a substrate by using an original plate laser interferometer and a substrate laser interferometer, respectively; and transferring a pattern of the original plate onto the substrate by scan exposure by moving the original plate stage and the substrate stage in a scan direction while performing control on the basis of the measured values, wherein the original plate laser interferometer comprises a Y-direction laser interferometer for measuring an original plate stage position in a Y direction as the scan direction and an X-direction laser interferometer for measuring an original plate stage position in an X direction perpendicular to the scan direction, the substrate laser interferometer comprises a Y-direction laser interferometer for measuring a substrate stage position in the Y direction and an X-direction laser interferometer for measuring a substrate stare position in the X direction, the measurements by the original plate and substrate Y-direction laser interferometers are performed by using light from a single Y-direction laser head, and the measurements by the original plate and substrate X-direction laser interferometers are performed by using light from a single X-direction laser head.

4. The method according to claim 3, wherein the original plate or substrate Y- or X-direction laser interferometer comprises two laser interferometers, and a position in a θ direction, around a Z-axis direction, of the original plate stage or the substrate stage is obtained on the basis of measured values obtained by the two laser interferometers.

5. An exposure apparatus for transferring a pattern of an original plate onto a substrate by exposure, said apparatus comprising:

first original plate measuring means for measuring the position of the original plate in a first direction by using light;

second original plate measuring means for measuring the position of the original plate in a second direction by using light;

first substrate measuring means for measuring the position of the substrate in the first direction by using light; and second substrate measuring means for measuring the position of the substrate in the second direction by using light, wherein the measurements by said first original plate measuring means and said first substrate measuring means are performed by using light from first output means, and the measurements by said second original plate measuring means and said second substrate measuring means are performed by using light from second output means.

6. A device fabrication method of transferring a pattern of an original plate onto a substrate by exposure, said method comprising:

a first original plate measuring step of measuring the position of the original plate in a first direction by using light;

a second original plate measuring step of measuring the position of the original plate in a second direction by using light;

a first substrate measuring step of measuring the substrate position in the first direction by using light; and a second substrate measuring step of measuring the substrate position in the second direction by using light, wherein the measurements in said first original plate measuring step and said first substrate measuring step are performed by using light from a first output means, and the measurements by said second original plate measuring step and said second substrate measuring step are performed by using light from a second output means.

* * * * *